(12) United States Patent
Rocha-Alvarez et al.

(10) Patent No.: US 7,572,337 B2
(45) Date of Patent: *Aug. 11, 2009

(54) BLOCKER PLATE BYPASS TO DISTRIBUTE GASES IN A CHEMICAL VAPOR DEPOSITION SYSTEM

(75) Inventors: Juan Carlos Rocha-Alvarez, Sunnyvale, CA (US); Ganesh Balasubramanian, Sunnyvale, CA (US); Tom K. Cho, Palo Alto, CA (US); Deenesh Padhi, Sunnyvale, CA (US); Thomas Nowak, Cupertino, CA (US); Bok Hoen Kim, San Jose, CA (US); Hichem M'Saad, Santa Clara, CA (US); Daemian Raj, Sunnyvale, CA (US)

(73) Assignee: Applied Materials, Inc., Santa Clara, CA (US)

(*) Notice: Subject to any disclaimer, the term of this patent is extended or adjusted under 35 U.S.C. 154(b) by 382 days.

This patent is subject to a terminal disclaimer.

(21) Appl. No.: 11/131,010

(22) Filed: May 16, 2005

(65) Prior Publication Data

US 2005/0263248 A1 Dec. 1, 2005

Related U.S. Application Data

(60) Provisional application No. 60/611,852, filed on Sep. 21, 2004, provisional application No. 60/574,823, filed on May 26, 2004.

(51) Int. Cl.
*C23C 16/455* (2006.01)
*C23F 1/00* (2006.01)
*H01L 21/306* (2006.01)
*C23C 16/06* (2006.01)
*C23C 16/22* (2006.01)

(52) U.S. Cl. .............. 118/715; 156/345.33; 156/345.34

(58) Field of Classification Search .................. 118/715; 156/345.33, 345.34
See application file for complete search history.

(56) References Cited

U.S. PATENT DOCUMENTS 5,360,144 A 11/1994 Slade (Continued)

FOREIGN PATENT DOCUMENTS

EP 0 821 084 1/1998

(Continued)

OTHER PUBLICATIONS

Tiemessen, M. et al., "Fluorine induced formation of intermetal dielectric effects", *Advanced Semiconductor Manufacturing Conference and Workshop*, 1996, ASMC 96 Proceedings, IEEE/SEMI 1996 Cambridge, MA, USA Nov. 12-14, 1996, New York, NY, USA, IEEE, US, Nov. 12, 1996 pp. 303-307, XP010204545, IBSN: 0-7803-3371-3, "Equipment Commonality", p. 305.

(Continued)

*Primary Examiner*—Rudy Zervigon
(74) *Attorney, Agent, or Firm*—Patterson & Sheridan

(57) ABSTRACT

Apparatus and methods for distributing gases into a processing chamber are disclosed. In one embodiment, the apparatus includes a gas distribution plate having a plurality of apertures disposed therethrough and a blocker plate having both a plurality of apertures disposed therethrough and a plurality of feed through passageways disposed therein. A first gas pathway delivers a first gas through the plurality of apertures in the blocker plate and the gas distribution plate. A bypass gas pathway delivers a second gas through the plurality of feed through passageways in the blocker plate and to areas around the blocker plate prior to the second gas passing through the gas distribution plate.

15 Claims, 7 Drawing Sheets

U.S. PATENT DOCUMENTS

| | | | |
|---|---|---|---|
| 5,532,190 | A | 7/1996 | Goodyear et al. |
| 5,725,675 | A | 3/1998 | Fong et al. |
| 5,741,363 | A | 4/1998 | Van Buskirk et al. |
| 5,844,195 | A | 12/1998 | Fairbairn et al. |
| 5,871,586 | A * | 2/1999 | Crawley et al. ............. 118/715 |
| 5,950,925 | A * | 9/1999 | Fukunaga et al. ........ 239/132.3 |
| 5,968,276 | A | 10/1999 | Lei et al. |
| 5,976,261 | A | 11/1999 | Moslehi |
| 6,029,602 | A | 2/2000 | Bhatnagar |
| 6,079,356 | A | 6/2000 | Umotoy et al. |
| 6,132,512 | A | 10/2000 | Horie et al. |
| 6,152,070 | A | 11/2000 | Fairbairn et al. |
| 6,190,732 | B1 | 2/2001 | Omstead et al. |
| 6,245,192 | B1 * | 6/2001 | Dhindsa et al. ........ 156/345.34 |
| 6,274,495 | B1 | 8/2001 | Omstead et al. |
| 6,291,341 | B1 * | 9/2001 | Sharan et al. ............... 438/648 |
| 6,302,964 | B1 | 10/2001 | Umotoy et al. |
| 6,364,949 | B1 | 4/2002 | Or et al. |
| 6,364,954 | B2 | 4/2002 | Umotoy et al. |
| 6,387,182 | B1 * | 5/2002 | Horie et al. ................. 118/244 |
| 6,444,039 | B1 | 9/2002 | Nguyen |
| 6,454,860 | B2 * | 9/2002 | Metzner et al. ............. 118/715 |
| 6,478,872 | B1 | 11/2002 | Chae et al. |
| 6,495,233 | B1 | 12/2002 | Shmurun et al. |
| 6,499,425 | B1 | 12/2002 | Sandhu et al. |
| 6,502,530 | B1 | 1/2003 | Turlot et al. |
| 6,508,197 | B1 | 1/2003 | Omstead et al. |
| 6,645,884 | B1 | 11/2003 | Yang et al. |
| 6,692,575 | B1 | 2/2004 | Omstead et al. |
| 6,902,629 | B2 | 6/2005 | Zheng et al. |
| 2001/0054381 | A1 | 12/2001 | Umotoy et al. |
| 2002/0017243 | A1 | 2/2002 | Pyo |
| 2002/0092471 | A1 | 7/2002 | Kang et al. |
| 2003/0017268 | A1 | 1/2003 | Hu et al. |
| 2003/0192568 | A1 | 10/2003 | Zheng et al. |
| 2003/0198754 | A1 | 10/2003 | Xi et al. |
| 2004/0052969 | A1 | 3/2004 | Lee et al. |
| 2004/0144490 | A1 | 7/2004 | Zhao et al. |
| 2004/0216844 | A1 | 11/2004 | Janakiraman |
| 2005/0263072 | A1 * | 12/2005 | Balasubramanian et al. 118/715 |

FOREIGN PATENT DOCUMENTS

| | | |
|---|---|---|
| EP | 0 843 339 A2 | 5/1998 |
| JP | 61005515 | 1/1986 |
| JP | 05152208 | 6/1993 |
| TW | 527435 | 4/2003 |
| TW | 539761 | 7/2003 |
| TW | 583335 | 4/2004 |
| WO | WO 99/66101 A | 12/1999 |
| WO | WO 01/04376 A | 1/2001 |
| WO | WO 01/16396 A1 | 3/2001 |
| WO | WO 03/065424 | 8/2003 |

OTHER PUBLICATIONS

PCT International Search Report for PCT/US03/39942, dated Jul. 12, 2004 (AMAT/7816.PC).

PCT International Search Report for PCT/US2005/017561, dated Aug. 9, 2005.

Taiwan IPO Notice of Allowance and Search Report dated Apr. 25, 2008, Taiwan Patent Application No. 94116785.

PCT International Search Report and Written Opinion dated Dec. 24, 2008 for International Application No. PCT/US2008/79272. (APPM/011894-PCT P).

Office Action dated Jul. 23, 2008 for U.S. Appl. No. 11/130,554. (APPM/009312).

Office Action dated Oct. 22, 2008 for U.S. Appl. No. 11/130,554. (APPM/009312).

* cited by examiner

BLOCKER PLATE BYPASS TO DISTRIBUTE GASES IN A CHEMICAL VAPOR DEPOSITION SYSTEM

CROSS-REFERENCE TO RELATED APPLICATIONS

This application claims benefit of U.S. Provisional Application Ser. No. 60/611,852, filed Sep. 21, 2004 and U.S. Provisional Application Ser. No. 60/574,823, filed May 26, 2004. This application is related to U.S. application Ser. No. 11/130,554, filed on May 16, 2005, which application claims benefit of U.S. Provisional Application Ser. No. 60/611,852, filed Sep. 21, 2004 and U.S. Provisional Application Ser. No. 60/574,823, filed May 26, 2004.

BACKGROUND OF THE INVENTION

1. Field of the Invention

Embodiments of the invention generally relate to semiconductor substrate processing systems. More particularly, embodiments of the invention relate to methods and apparatus for delivering gases into a processing chamber.

2. Description of the Related Art

Materials such as oxides are typically deposited on a substrate within a process chamber, such as a chemical vapor deposition (CVD) chamber, during fabrication of integrated circuits and semiconductor devices. A gas distribution plate or faceplate of the deposition chamber includes a plurality of spaced holes that process gases pass through to aid in distributing the materials in the chamber. The deposition processes typically result in deposition of some of the materials on walls and components of the deposition chamber. For example, a layer of deposition material often forms on the gas distribution plate, which may clog the holes of the plate or flake off in particles that rain down on the substrate, thereby affecting the uniformity of deposition on the substrate and contaminating the substrate. Consequently, the interior of the deposition chamber requires cleaning on a regular basis.

There exist several methods for cleaning the deposition chamber including the gas distribution plate using cleaning gases. For example, a remote plasma cleaning procedure may be employed using an etchant plasma generated remotely from the deposition chamber by introduction of an etchant gas such as a fluorine containing gas to a remote high density plasma source, which may be a microwave plasma system, a toroidal plasma generator or a similar device. Dissociated species from the etchant plasma transported to the deposition chamber react with and etch away the undesired deposition build up. Another method to remove the unwanted deposition material that builds up on the interior of chamber walls involves an in situ chamber clean operation. Common in situ chamber cleaning techniques include the use of an etchant gas such as a fluorine containing gas to remove the deposited material from the chamber walls and other areas. The etchant gas is introduced into the chamber and plasma is formed within the chamber so that the etchant gas reacts with and removes the deposited material from the chamber walls.

In prior CVD chambers, both the process gases and the cleaning gases pass through a common feed path to a blocker plate that aids in uniformly distributing the gases prior to their passage through the gas distribution plate. Some deposition processes operate at reduced flow significantly reducing chamber cleaning efficiency when the cleaning gases are passed through the common feed that is adapted for the reduced flow. The lower clean efficiency increases the amount of time it takes to clean the chamber, increases the amount of cleaning gases consumed, and reduces the number of substrates that can be processed in a given time (i.e., throughput).

One design that enables the cleaning gases to bypass the blocker plate routes all of the cleaning gases to a periphery of the gas distribution plate in order to increase the cleaning rate at the perimeter of the chamber compared to the center of the chamber. However, the center of the chamber may not be sufficiently cleaned with all the cleaning gases directed to the periphery of the gas distribution plate.

Therefore, a need exists for apparatus and methods for delivering gases into a chamber that enables independent control of processing gases and cleaning gases. A further need exists for apparatus and methods for controlling the ratio of cleaning gases directed toward the center of the chamber and the perimeter of the chamber.

SUMMARY OF THE INVENTION

Embodiments of the invention generally provide apparatus and methods for distributing gases into a processing chamber. In one embodiment, the apparatus includes a gas distribution plate having a plurality of apertures disposed therethrough and a blocker plate having both a plurality of apertures disposed therethrough and a plurality of feed through passageways disposed therein. A first gas pathway delivers a first gas through the plurality of apertures in the blocker plate and the plurality of apertures in the gas distribution plate. A bypass gas pathway delivers a second gas through the plurality of feed through passageways in the blocker plate and to areas around the blocker plate prior to the second gas passing through the gas distribution plate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
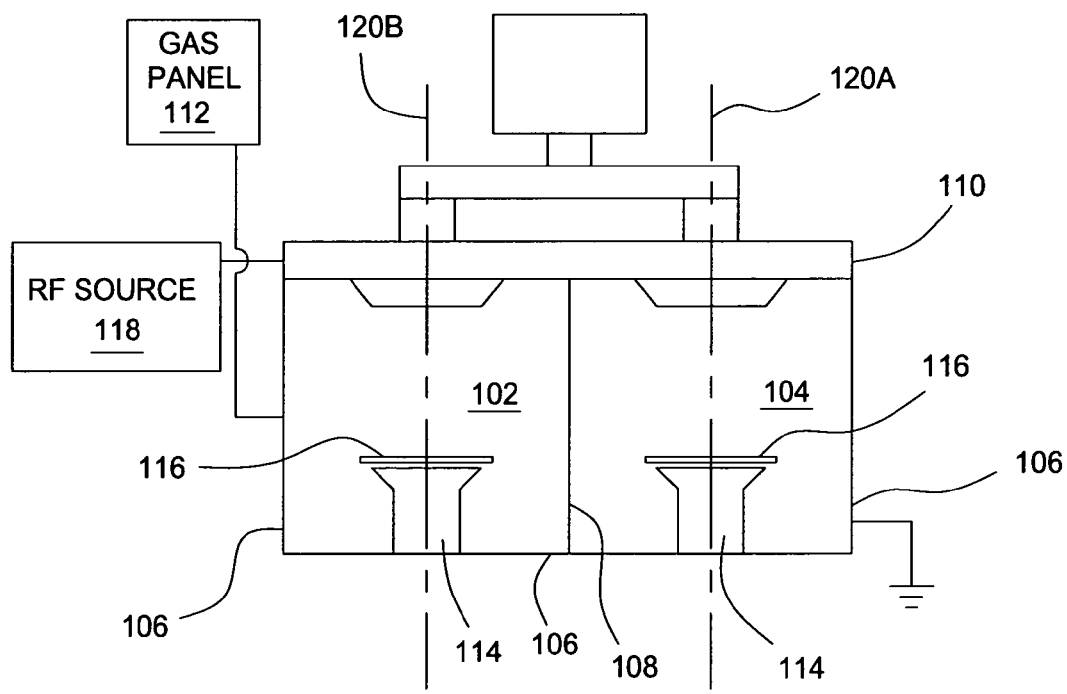
FIG. 1 is a schematic view of a chemical vapor deposition (CVD) system, which incorporates various embodiments of the present invention.

Embodiments of the invention generally relate to apparatus and methods for distributing gases into a processing chamber, such as a chemical vapor deposition (CVD) apparatus. FIG. 1 illustrates an exemplary CVD apparatus 100, which incorporates various embodiments of the invention. In one embodiment, the CVD apparatus 100 is an improvement of a Producer® chamber, which is commercially available from Applied Materials, Inc. of Santa Clara, Calif. The CVD apparatus 100 is described in more detail in commonly assigned U.S. Pat. No. 6,495,233 B1, issued Dec. 17, 2002, which is incorporated herein by reference. Although embodiments of the invention are described with reference to the Producer® chamber, other CVD reactors and chambers may also be modified to practice various embodiments of the invention, such as the DXZ® Chamber, which is also commercially available from Applied Materials, Inc. of Santa Clara, Calif. The DXZ® Chamber is disclosed in commonly assigned U.S. Pat. No. 6,364,954 B2, issued Apr. 2, 2002, which is incorporated herein by reference.

The CVD apparatus 100 includes electrically grounded external walls 106, an internal wall 108, and a gas distribution assembly 110, which concurrently define a first chamber 102 and a second chamber 104. The internal wall 108 isolates the first and second chambers 102 and 104 from one another. Pedestals 114 disposed substantially centered within each of the chambers 102 and 104 support substrates 116. The substrates 116 rest on, or secure to, the pedestals 114 through the use of electrostatic force, mechanical or vacuum clamping, gravitational force or the like. A gas panel 112 couples to the CVD apparatus 100 and provides process and other gases as required for conventional CVD to occur within the first and second chambers 102 and 104. The CVD chamber 100 may also couple to an RF source 118 for forming a plasma within the chamber.

Figure 2:
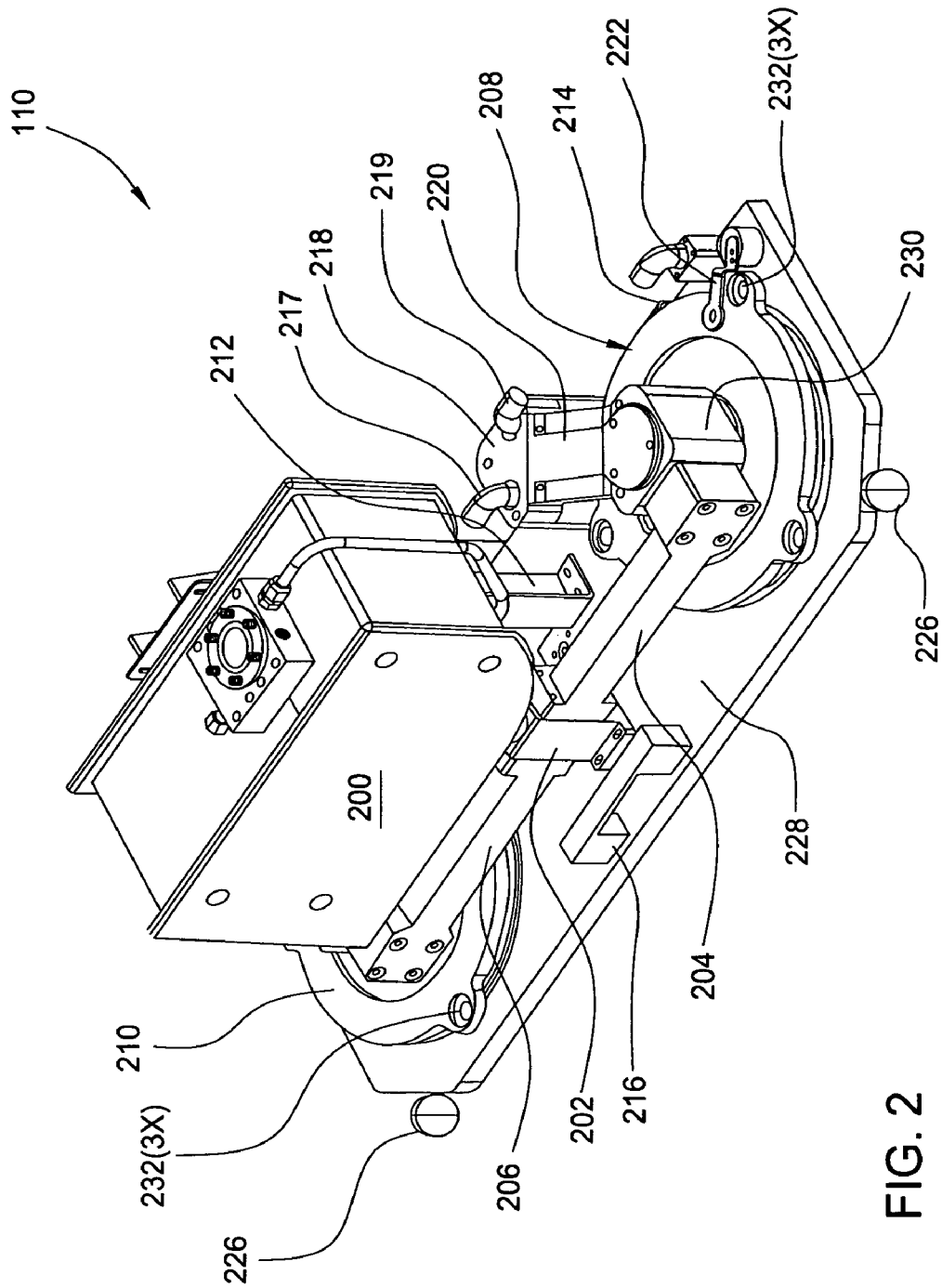
FIG. 2 is a perspective view of a gas distribution assembly for the CVD system, which incorporates various embodiments of the present invention.
Figure 3:
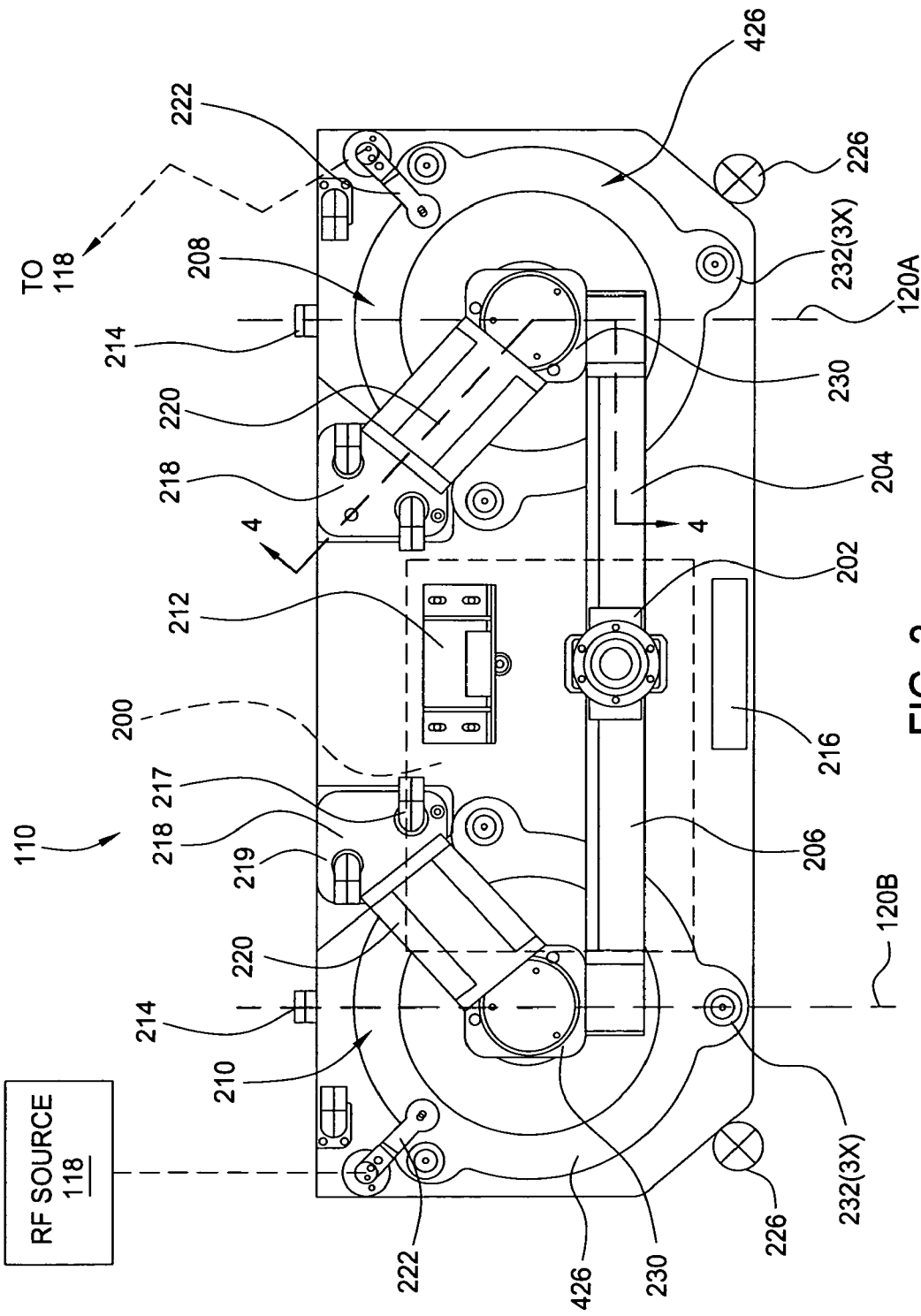
FIG. 3 is a top plan view of the gas distribution assembly, which incorporates various embodiments of the present invention.

FIGS. 2 and 3 illustrate perspective and top views of the gas distribution assembly 110. The gas distribution assembly 110 includes a lid plate 228, a first gas box 208, a second gas box 210, and a remote plasma source 200. The first gas box 208 is centrally disposed on the lid plate 228 along the chamber centerline 120A, and the second gas box 210 is centrally disposed on the lid plate 228 along the chamber centerline 120B. The lid plate 228 is generally fabricated from a conductive material, such as aluminum. The lid plate 228 affixes to one of the electrically grounded external walls 106 by one or more hinges 214, and a handle 216 facilitates opening of the lid plate 228. A fastening mechanism 226, i.e., a captive latch, secures the lid plate 228 to the chambers 102 and 104 when the gas distribution assembly 110 is in a closed position. The gas distribution assembly 110 additionally includes a pair of inlet manifolds 218 (one of which is partially obscured by the remote plasma source 200 in FIG. 2) and a pair of constant voltage gradient feed channels 220 (also, one of which is partially obscured by the remote plasma source 200 in FIG. 2). Each inlet manifold 218 disposed upon the lid plate 228 adjacent to each gas box 208 and 210 receives process gases from gas passages 424 that are in fluid communication with the gas panel 112 (shown in FIG. 1). The feed channel 220 defines a feed passage 425 (shown in FIG. 4) that connects each inlet manifold 218 to the respective gas box. Commonly assigned U.S. Pat. No. 5,725,675, which is incorporated herein by reference, fully describes an exemplary feed channel. The feed channel 220 is made of an electrically insulating material and electrically isolates the inlet manifold 218 from the gas boxes 208 and 210. To control the temperature of the gas distribution assembly 110, each inlet manifold 218 includes an inlet heat exchange fitting and an outlet heat exchange fitting 217 and 219, respectively, for circulating a cooling fluid, e.g., water. The cooling fluid circulates at a temperature range of about 65 degrees Celsius to about 70 degrees Celsius through channels (not shown) extending through each inlet manifold 218 and the gas distribution assembly 110.

The remote plasma source 200 delivers and sustains a cleaning gas for removing unwanted deposition material from chambers 102 and 104. The cleaning gas may be a halogen-containing gas, such as a fluorine-containing gas. Preferably, the cleaning gas is $NF_3$. The processing conditions and ranges described herein for cleaning gases can be used with $NF_3$. Other cleaning gases that can be used include $F_2$, $C_4$, $C_3F_8$, $C_2F_4$, $SF_6$, $C_2F_6$, $CCl_4$, and $C_2Cl_6$. The remote plasma source 200 may be an ASTRON® generator, which is commercially available from MKS Instruments, Inc. of Wilmington, Mass. A bracket 212 centrally supports the remote plasma source 200 above the lid plate 228.

The remote plasma source 200 delivers the cleaning gas to the chambers 102 and 104 via a divider 202, a first conduit 204, and a second conduit 206. The divider 202 couples to the remote plasma source 200 and both the first conduit 204 and the second conduit 206 to form a "tee." The first conduit 204 couples the divider 202 to the first gas box 208 while the second conduit 206 couples the divider 202 to the second gas box 210. The first and second conduits 204 and 206 are fabricated from a dielectric material to electrically isolate the gas boxes 208 and 210 from the remote plasma source 200. The cleaning gas thus enters the respective chamber by flowing out of the remote plasma source 200 into the divider 202, then through the respective conduit and gas box into the respective chamber. Although the CVD apparatus 100 shown includes only a single remote plasma source 200, embodiments of the invention may be used with any chamber having any number of remote plasma sources. For example, commonly assigned U.S. Ser. No. 10/122,481, filed Apr. 12, 2002 and entitled "METHOD FOR CLEANING A PROCESS CHAMBER," which is incorporated herein by reference, describes a Producer® chamber with two remote plasma sources.

Figure 4:
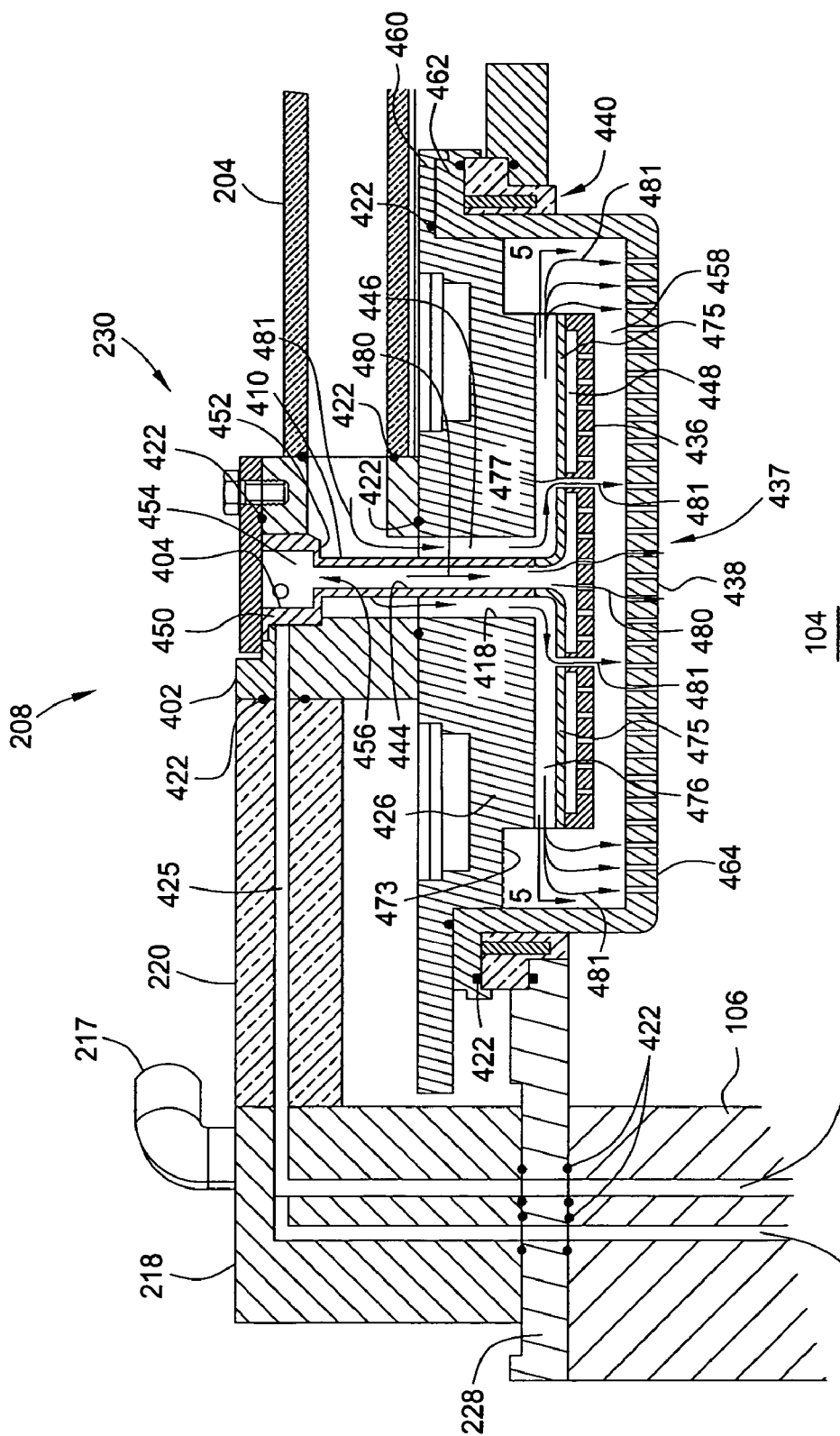
FIG. 4 is a partial cross section of the gas distribution assembly of FIG. 3 along a section line 4-4.

As shown in FIG. 4, the first gas box 208 (and the second gas box 210 which is not shown but is analogous to the first gas box 208) includes a mixing block 230, a mounting plate 426 and a showerhead 437. The showerhead 437 includes a blocker plate 436 and a generally dish-shaped gas distribution plate 438 having a perforated bottom 464. The mounting plate 426 includes a center aperture 418 and three mounting holes 232 for securing the mounting plate to the lid plate 228. The mounting plate and gas distribution plate 438 are fabricated from a conductive material, such as aluminum. RF coupling tabs 222 (shown in FIG. 3) couple the mounting plates 426 of the first and second gas boxes 208 and 210 to the RF source 118. The RF power couples through the mounting plate 426 to the gas distribution plate 438 since a rim 462 of the gas distribution plate 438 abuts against a flange 460 of the mounting plate 426. An isolator 440 disposed between the lid plate 228 and the gas distribution plate 438 and fabricated from an insulative dielectric material such as a fluoropolymer or ceramic electrically insulates the gas box 208 from the lid plate 228.

An inward shoulder 473 around the bottom perimeter of the mounting plate 426 defines a center portion 475 or protrusion of the mounting plate 426 spaced from and surrounded by the gas distribution plate 438. The blocker plate 436 couples to the bottom surface of the center portion 475 of the mounting plate 426. The blocker plate 436 includes an annular lip facing the mounting plate 426 that forms a gap 448 between the blocker plate 436 and the center portion 475 of the mounting plate 426. Thus, the blocker plate 436 that is perforated to allow gas passage enables build up of back pressure of the processing gases and radial diffusion of the processing gases within the gap 448. The blocker plate 436 may be a high pressure blocker plate having reduced number of perforations and/or reduced diameter of apertures forming the perforations in order to provide sufficient back pressure such as when depositing low dielectric constant material (e.g., Black Diamond™ process commercially available from Applied Materials, Inc. of Santa Clara, Calif.). Space between the blocker plate 436 and the gas distribution plate 438 defines a plenum 458. Thus, the perforated bottom 464 of the gas distribution plate 438 subjects the processing gases and the cleaning gases to a slight flow restriction that causes the various gases to further diffuse radially across the gas distribution plate 438 prior to passing into the chamber 104.

The mixing block 230 that is centrally disposed upon the mounting plate 426 distributes the processing gases from the passage 425 to a first flow path passing through the blocker plate 436 and distributes the cleaning gases from the first conduit 204 to a bypass flow path that bypasses the blocker plate 436. Arrows 480 illustrate flow through the first flow path, while arrows 481 illustrate flow through the bypass flow path. The mixing block includes a housing 402, a vortex generator 404, and a gas delivery tube 410. The vortex generator 404 includes a wall 450 and a bottom 452 that define a substantially cylindrical interior volume 454 having an exit aperture 456. Commonly assigned U.S. Pat. No. 6,495,233 B1, issued Dec. 17, 2002, which is incorporated herein by reference, describes in detail an exemplary vortex generator. A center passage 444 of the gas delivery tube 410 aligns with the exit aperture 456. The gas delivery tube 410 affixes to the bottom 452 of the vortex generator 404 and couples to the mounting plate 426 so that processing gases and other gases passing through the vortex generator 404 from the passage 425 flow through the first fluid path to the gap 448 ahead of the blocker plate 436. Additionally, the housing 402 defines an internal flow passage surrounding the delivery tube 410 and separated from the center passage 444 of the delivery tube 410. The internal flow passage through the housing 402 distributes flow from the first conduit 204 to the bypass flow path so that the cleaning gases and other gases from the first conduit 204 flow separately to the bypass flow path, as illustrated by arrows 481.

Figure 5:
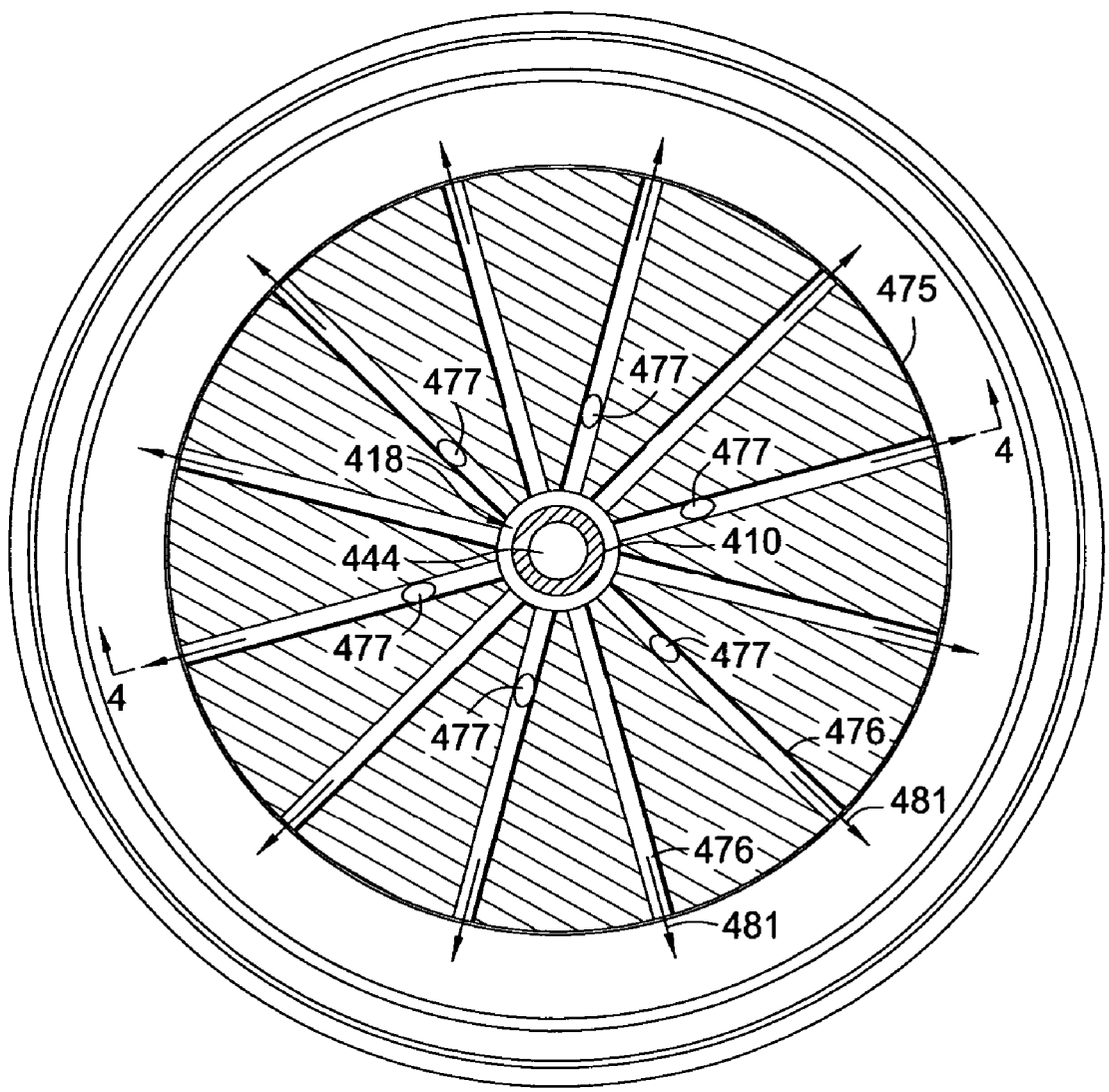
FIG. 5 is a partial cross section of the gas distribution assembly of FIG. 4 along a section line 5-5.

As shown in FIGS. 4 and 5, the bypass flow path includes a plurality of radially extending bores or spokes 476 disposed in the center portion 475 of the mounting plate 426 and a plurality of feed throughs 477 extending downward from inward locations along the spokes 476. The center aperture 418 through the mounting plate 426 includes an upper portion with an increased diameter defining an annular area 446 between the delivery tube 410 and the mounting plate 426 that enables fluid flow between the spokes 476 and the mixing block 230. Alternatively, the annular area 446 may be replaced with discrete longitudinal channels in the mounting plate 426 that provide fluid communication between each of the spokes 476 and the mixing block 230. If the discrete longitudinal channels couple the spokes 476 and the mixing block 230, the center aperture 418 of the mounting plate 426 may itself define a portion of the first flow path between the delivery tube 410 and the blocker plate 436. The feed through 477 includes an aperture in the bottom of the center portion 475 of the mounting plate 426 that extends to the spoke 476 and aligns with a passage through a central region of the blocker plate 436. A doughnut-shaped lip of the blocker plate 436 defines the passage and separates the gap 448 from the feed through 477 such that flow through the feed through 477 bypasses the perforations of the blocker plate 436. Thus, the spoke 476 provides both a perimeter outlet for flow of the cleaning gases to the plenum 458 at a side of the center portion 475 where the spoke terminates and a central outlet for flow of the cleaning gases to the plenum 458 at the location of the feed through 477.

Figure 6:
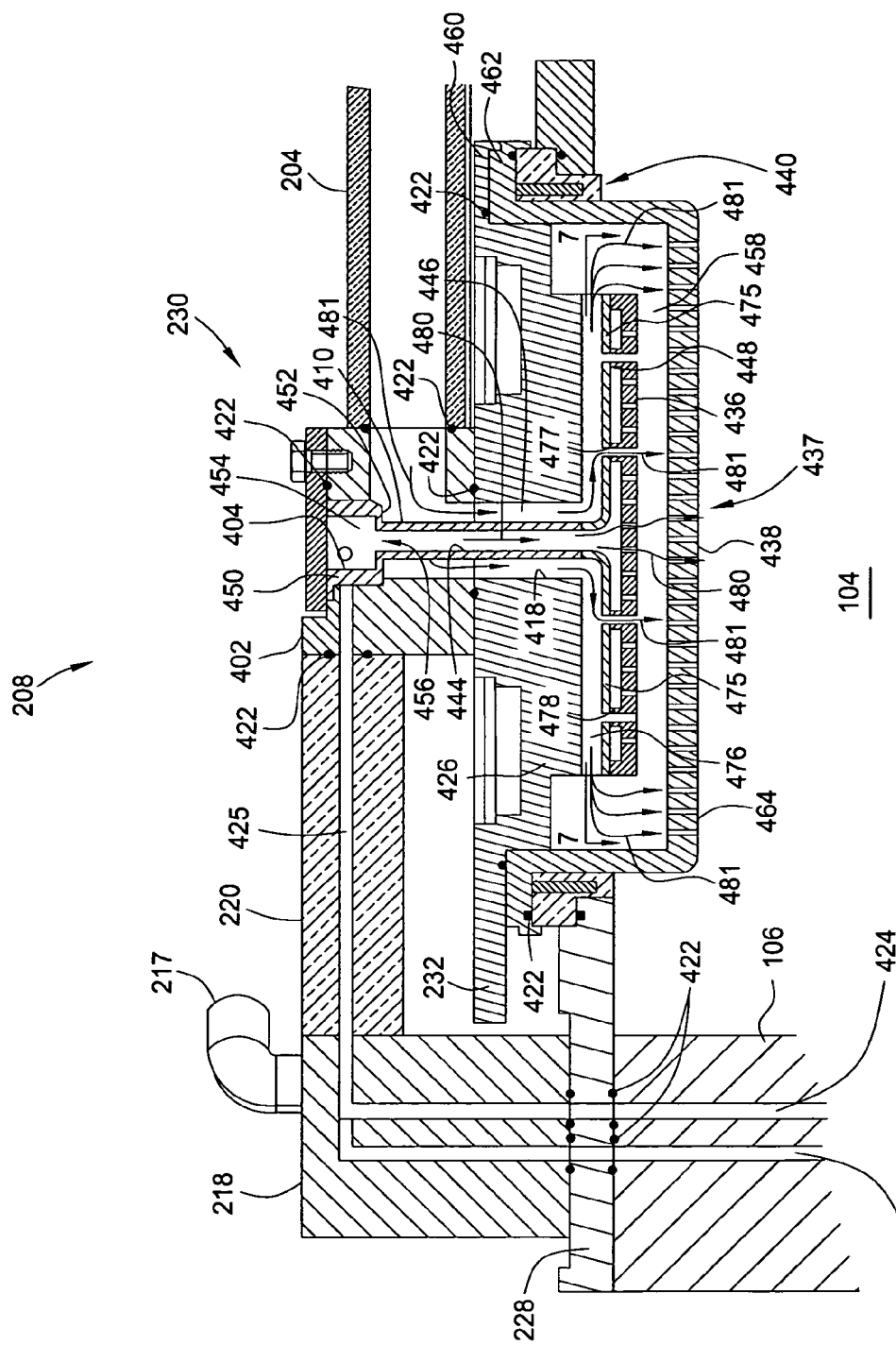
FIG. 6 is a partial cross section of an alternative embodiment of a gas box for use in a gas distribution assembly for a CVD system.
Figure 7:
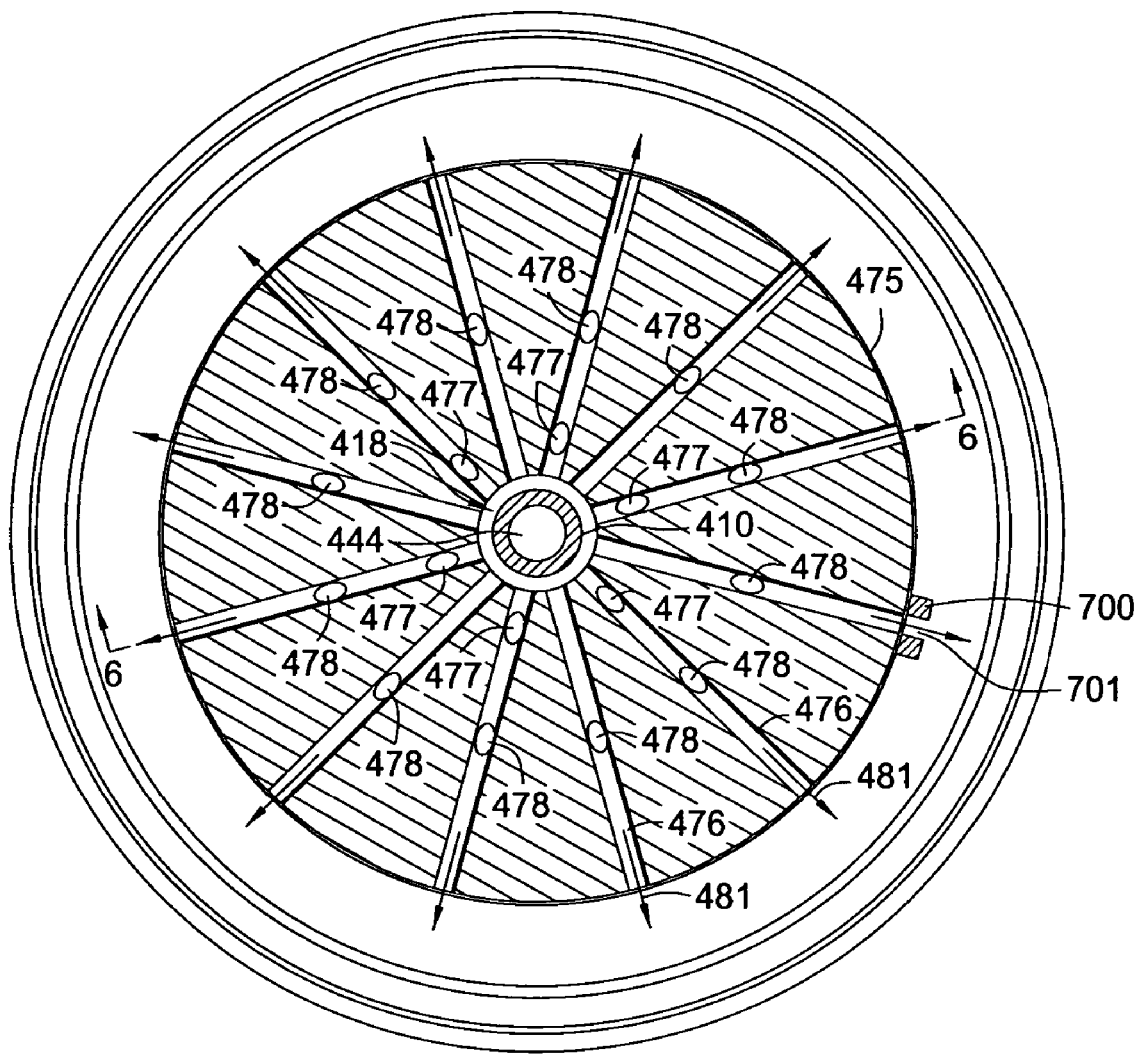
FIG. 7 is a partial cross section of the gas distribution assembly of FIG. 6 along a section line 7-7.

FIGS. 6 and 7 illustrate an alternative embodiment of the invention having an additional feed through 478 spaced outward in a radial direction from the feed through 477. As seen by this embodiment, the arrangement, number and spacing of the feed throughs 477 and 478 can take the form of an infinite number of configurations. Controlling the diameter of the bore forming the spoke 476 and/or the number, size and/or location of the feed throughs 477 and 478 effectively controls the ratio of cleaning gases directed toward the center of the chamber 104 and the cleaning gases directed toward the perimeter of the chamber 104. The diameter of the bore forming the spoke 476 can be determined initially during manufacture or subsequently by the addition of a block 700 (only one is shown in FIG. 7) secured at the perimeter outlet of the spoke that has an orifice 701 of predetermined size to restrict flow from the spoke 476. Due to the bypass flow path, this flow control of the cleaning gases is independent from the flow of the processing gases.

A series of o-rings 422 are disposed between the isolator 440 and the lid plate 228, the isolator 440 and the gas distribution plate 438, the mixing block 230 and the mounting plate 426, and the gas distribution plate 438 and the mounting plate 426 to ensure gas delivery into the respective chamber. The o-rings 422 are generally made of a material compatible with the processing and cleaning gases used in the CVD apparatus 100.

In operation, the substrates 116 are set upon the pedestals 114 in each of the chambers 102 and 104. A pump (not shown) evacuates the chambers 102 and 104. The processing gases are delivered to the mixing block 230 of each gas box 208 and 210, and thoroughly mixed in a cyclonic manner. Once mixed, the processing gases exit the mixing block 230 via the gas delivery tube 410, entering the respective chambers through the blocker plate 436 and the gas distribution plate 438. The processing gases then deposit a layer of material upon the substrates 116. In one embodiment, the layer of material may have a low dielectric constant, e.g. about 3 or less. Once the desired thickness of deposition is achieved, the processing gases are removed from the chambers 102 and 104.

Optionally, the deposition process may be enhanced by forming a plasma of the processing gases within the chamber. If desired, the optional RF power source 118 is coupled to the gas boxes via the RF coupling tabs 222. The RF power may be coupled to the gas distribution plate 438 to bias the gas distribution plate 438, thereby igniting and sustaining the plasma of the mixed processing gases within the chambers.

After the substrates 116 have been removed, the chambers may be cleaned using the remote plasma source 200, which is configured to generate the cleaning gases (i.e., in the form of free radicals). Once generated, the cleaning gases are delivered through the divider 202 and the conduits to the gas boxes. From the gas boxes, the cleaning gases flow through the center aperture 418 surrounding the gas delivery tube 410, through the spokes 476 and feed throughs 477, and through the gas distribution plate 438. As the cleaning gases flow through various components in the chambers, those components, including the gas distribution plate 438, are effectively scrubbed or etched of substantially all material that may have been deposited during the deposition process.

The amount of cleaning gases (i.e., in the form of free radicals) that flow through the gas distribution plate 438 increases by directing the cleaning gases around the blocker plate 436 and through central regions of the blocker plate 436 at locations of the feed throughs 477 since passing the cleaning gas through the blocker plate 436 tends to cause radical recombination. In one example, a standard gas block that flows both cleaning and processing gases through the same path, which includes a high pressure blocker plate, provides an etch rate of approximately 9500 Å/min using $NF_3$ as an etchant gas. Further, a uniformity ratio defined by the ratio of the high etch rate to the low etch rate across the chamber when using the standard gas block is about 2.29 compared to an ideal uniformity ratio of 1.0 where the etch rate is completely uniform. However, the etch rate significantly increases to approximately 16,500 Å/min (approximately a 75% improvement) if the etchant gas flows through the bypass flow path according to the embodiment shown in FIGS. 4 and 5. In this example, the diameter of the bore of the spokes 476 is 0.35 inches and the diameter of the feed throughs 477 is 0.2 inches. Additionally, the etch rate uniformity improves as evidenced by a uniformity ratio of about 1.3 when using the bypass flow path to direct the etchant gas into the chamber. Thus, the bypass flow path improves the clean rate in the chamber 104 both at the perimeter and the center.

The high pressure blocker plate used in the example includes 500 apertures each having a diameter of 0.16 millimeters that form the perforations therethrough. Use of the high pressure blocker plate improves film deposition uniformity on the substrates. Compared to a prior blocker plate with more holes and/or increased diameter holes that provides a film uniformity of 3% in a first chamber and 2.6% in a second chamber, the high pressure blocker plate provides a film uniformity of 1.1% in both chambers. Furthermore, the high back pressure effectively controls flow splitting of the process gases to each of the two chambers. Specifically, the prior art blocker plate provides a film thickness mismatch between the two chambers of 5% while the high pressure blocker plate provides a film thickness mismatch between the two chambers of less than 1%.

Embodiments of the invention described herein are not limited to any specific apparatus or to any specific plasma excitation method. Although embodiments of the invention are described with reference to a remote plasma source, embodiments of the invention may also be practiced in connection with other clean operations, such as an in-situ clean operation. The above CVD system description is mainly for illustrative purposes, and other CVD equipment such as electrode cyclotron resonance (ECR) plasma CVD devices, induction-coupled RF high density plasma CVD devices, or the like may be employed. Additionally, variations of the above described system such as variations in substrate support pedestal design, heater design, gas box design, remote plasma source design, location of power connections and others are possible.

While the foregoing is directed to embodiments of the present invention, other and further embodiments of the invention may be devised without departing from the basic scope thereof, and the scope thereof is determined by the claims that follow.

The invention claimed is:

1. An apparatus for distributing gases into a processing chamber, comprising: a gas distribution plate in the chamber, wherein the gas distribution plate has a plurality of apertures disposed therethrough; and a blocker plate spaced above the gas distribution plate, wherein the blocker plate has a plurality of apertures disposed therethrough and feed through passages extending through a center region of the blocker plate; wherein a first gas pathway is configured to deliver a first gas sequentially through the apertures of both the blocker plate and the gas distribution plate; and wherein a second gas pathway is configured to deliver a second gas (i) around the blocker plate and through the apertures of the gas distribution plate without passing through the blocker plate, and (ii) through the feed through passages extending through a center region of the blocker plate and through the apertures of the gas distribution plate, without mixing first and second gases prior to the first gas passing through the apertures of the blocker plate.

2. The apparatus of claim 1, wherein the second gas pathway includes a radial passage having a perimeter outlet proximate a perimeter of the chamber.

3. The apparatus of claim 2, wherein the second gas pathway includes a feed through passage that extends from the radial passage and through the blocker plate, the feed through passage being disposed along the radial passage at an inward radial location.

4. The apparatus of claim 2, wherein the second gas pathway includes at least two feed through passages that extend from the radial passage and through the blocker plate, the feed through passages disposed along the radial passage at inward radial locations.

5. The apparatus of claim 2, further comprising a block secured to the perimeter outlet that includes an orifice of predetermined size to control flow of the second gas through the radial passage.

6. The apparatus of claim 1, wherein the processing chamber is a chemical vapor deposition chamber.

7. The apparatus of claim 1, wherein the blocker plate includes approximately 500 apertures.

8. The apparatus of claim 1, wherein the blocker plate includes approximately 500 apertures that each have a diameter of approximately 0.16 millimeters.

9. An apparatus for distributing gases into a processing chamber, comprising: a gas distribution plate in the chamber, wherein the gas distribution plate has a plurality of apertures disposed therethrough; a mounting plate in the chamber, wherein the mounting plate has a plurality of radial bores therein that provide perimeter outlets to an area between the mounting plate and the gas distribution plate, the radial bores in fluid communication with a gas distribution assembly; and a blocker plate disposed between the mounting plate and the gas distribution plate, wherein a first side of the blocker plate is in fluid communication with the gas distribution assembly and a first flow is passable through the blocker plate to the area between the mounting plate and the gas distribution plate on a second side of the blocker plate such that a second flow flows from the outlets at termini of the radial bores and from the first side of the blocker plate is passable through common ones of the apertures of the gas distribution plate without mixing the first and second flows prior to the first flow passing through the blocker plate.

10. The apparatus of claim 9, further comprising feed through passages that extend from the radial bores and through the blocker plate, the feed through passages disposed along the radial bores at inward radial locations.

11. The apparatus of claim 10, wherein selected ones of the radial bores have at least two feed through passages.

12. The apparatus of claim 9, further comprising blocks secured to the perimeter outlets, each block including an orifice of predetermined size to control flow of the second gas through the radial bores.

13. The apparatus of claim 9, wherein the processing chamber is a chemical vapor deposition chamber.

14. The apparatus of claim 9, wherein the blocker plate includes approximately 500 apertures.

15. The apparatus of claim 9, wherein the blocker plate includes approximately 500 apertures that have a diameter of approximately 0.16 millimeters.

* * * * *